(12) United States Patent
Reiche et al.

(10) Patent No.: US 6,333,710 B1
(45) Date of Patent: Dec. 25, 2001

(54) METHOD FOR MEASURING THE TIME DELAY BETWEEN TWO PERIODIC PULSE SIGNALS OF THE SAME FREQUENCY

(75) Inventors: Martin Reiche, Königswinter; Wolfgang Kostorz, Bietigheim-Bissingen, both of (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 0 days.

(21) Appl. No.: 09/459,489

(22) Filed: Dec. 13, 1999

(30) Foreign Application Priority Data

Dec. 21, 1998 (DE) .............................................. 198 59 082

(51) Int. Cl.[7] ....................................................... G01S 7/28
(52) U.S. Cl. .......................................... 342/118; 342/175
(58) Field of Search .......................... 342/118–125, 127, 342/165, 169–174, 175, 195

(56) References Cited

U.S. PATENT DOCUMENTS 4,236,157    11/1980   Goss et al. .
5,442,360 *  8/1995   Maignan et al. ..................... 342/120
6,008,754 * 12/1999   Roos ................................... 342/174

FOREIGN PATENT DOCUMENTS 689 13 423    6/1994   (DE) .

OTHER PUBLICATIONS

Tilo Pfeifer Handbuch der industriellen Meßtechnik, R. Oldenbourg, Munich, 1992, 5th Edition, pp. 745–749.

* cited by examiner

Primary Examiner—Bernarr E. Gregory
(74) Attorney, Agent, or Firm—Paul Vincent

(57) ABSTRACT

The invention concerns a device for measuring the time delay between a first periodic pulse signal (2) and a second periodic pulse signal (5) having the same frequency as the first pulse signal (2). In order to determine the time delay between the two periodic pulse signals (2, 5) in as accurate a fashion as possible, the invention proposes a device which is characterized by means for producing a periodic diagnostic signal (18), having half the frequency of the first pulse signal (2), whose sampling ratio is a measure for the time delay between the first pulse signal (2) and the second pulse signal (5) as well as means for determining the sampling ratio of the diagnostic signal (18) and means for determining the time delay between the first pulse signal (2) and the second pulse signal (5) from the sample ratio of the diagnostic signal (18).

26 Claims, 5 Drawing Sheets

METHOD FOR MEASURING THE TIME DELAY BETWEEN TWO PERIODIC PULSE SIGNALS OF THE SAME FREQUENCY

This application claims Paris Convention priority of German Patent Application DE 198 59 082.2 filed Dec. 21, 1998 the entire disclosure of which is hereby incorporated by reference.

BACKGROUND OF THE INVENTION

The present invention concerns a method for measuring the time delay between a first periodic pulse signal and a second periodic pulse signal having the same frequency as the first pulse signal.

The invention also concerns a method for measuring the separation between two objects using a sensor disposed on one of the objects, wherein the sensor triggers a first periodic pulse signal and transmits it towards the other object, the first pulse signal, reflected from the other object and delayed by a propagation time dependent on the separation between the two objects, is received by the sensor, the sensor triggers a second periodic pulse signal delayed by a variable time delay, the variable time delay of the second pulse signal is varied, and the variable time delay is determined which is equal to the propagation time of the received reflected first pulse signal.

The invention also concerns a device for measuring the time delay between a first periodic pulse signal and a second periodic pulse signal having the same frequency as the first pulse signal.

Finally, the present invention concerns a sensor for measuring the separation between two objects, wherein the sensor is disposed on one of the objects and has:

first means for triggering and for transmitting a first periodic pulse signal towards the other object, second means for receiving the first pulse signal reflected from the other object which is delayed by a propagation time in dependence on the distance between the two objects, third means for triggering a second periodic pulse signal delayed by a variable time delay, fourth means for varying the variable time delay of the second pulse signal, and fifth means for determining the adjusted variable time delay which is equal to the propagation time of the first received reflected pulse signal.

Measurement of the time delay between two periodic pulse signals having the same frequency is done for a plurality of different applications. A preferred application is the measurement of the distance between two objects. The objects can e.g. be motor vehicles. Conventionally, the separation between two motor vehicles, driving one behind the other, is kept constant through regulation of the speed of the trailing motor vehicle. Towards this end, the trailing motor vehicle has a sensor of the above mentioned kind in its forward region for measuring the distance from the leading motor vehicle.

In order to measure the distance between two objects using a sensor disposed on one of the objects, sensors are normally used which determine the propagation time of a first periodic pulse between its transmission by the sensor, its reflection on the other object, and up to receipt by the sensor. The propagation time of the first pulse signal is given by twice the separation between the two objects divided by the propagation speed of the first pulse signal. In this manner, the propagation time of the received first pulse signal can be utilized to determine the separation between the two objects. Ultrasonic sensors and pulse radar sensors operate on this principle. Ultrasonic sensors (radiating pulse signals in the form of sound waves) have a propagation speed for the pulse signals approximately corresponding to the speed of sound (in air approximately 330 m/s) and pulse radar sensors (electromagnetic waves are radiated as pulse signals) have the speed of light (in air approximately $300 \cdot 10^6$ m/s). In particular for pulse radar sensors, the propagation times which are to be determined, assuming a maximum measuring region of a few meters, lie in the nanosecond region. Assuming a measurement region of e.g. 10 m, the propagation time of the signal is approximately $66 \cdot 10^{-9}$ s=66 ns. Since this pulse signal propagation time is extremely short, such pulse propagation times cannot be directly measured using e.g. a clock set with a START when the signal is transmitted and a STOP upon receipt of the reflected signal. Rather, indirect comparative methods are utilized to determine the pulse propagation times.

These comparative methods operate e.g. according to the following principle. A sensor pulse repetition generator triggers the first periodic pulse signal. The first pulse signal requires a certain propagation time between its transmission by the sensor, its reflection on the other object and up to reception by the sensor. In order to determine this propagation time, the sensor or the pulse repetition generator triggers a second periodic pulse signal having the same frequency as the first pulse signal but delayed by a variable time delay relative to the first pulse signal using a variable dead time component within the sensor. The control of the variable dead time member is effected using a relatively slowly varying sweeping voltage.

Both the received first pulse signal as well as the delayed second pulse signal are introduced to a mixer which delivers a maximum output signal when the propagation time of the received first pulse signal is precisely equal to that of the delay of the second pulse signal, as adjusted via the variable dead time component.

It would theoretically be sufficient to solely control the sweep of the internal delay through a time range corresponding to the measuring range of the sensor. In the event that the sensor e.g. has a measurement range of 10 m to 1000 m, the delay in a variable dead time component could be varied in the time range from 66 ns up to 6.6 $\mu$s by continuously changing the sweep voltage.

Such a pure control procedure has however the disadvantage that drifts in the dead time properties of the dead time components due to the operating temperature of the sensor and aging processes in the sensor as well as to differences in manufactured characteristics of various components of the sensor can not be taken into consideration. Since the dead time component is normally analog, a drift in the dead time properties is hardly avoidable. For this reason, one cannot rely on a pure control procedure only and a regulation process must be used. The measurement procedure is then as follows. The sweep voltage is continuously and repetitively swept (e.g. a saw tooth) through a certain range so that the internal delay of the dead time component is varied over time e.g. from 0 ns to 40 ns (corresponding to a measurement region of approximately 0 m to 6 m). If, during this process, the reflected first pulse is incident on the receiver means having an external propagation time which corresponds to the instantaneously adjusted internal delay, this results in a detect able increase in the output signal on the mixer. one then checks which internal delay had been adjusted at this point in time of maximum mixer output. This delay can be determined using the sweep voltage itself to avoid problems resulted from unknown measured quantities (due to aging effects and component variations) when converting the sweep voltage into the internal delay. Another possibility is to measure the pulse sides of the first and the second pulse signals and the rely determine the adjusted delay. Therefore, a regulation procedure in the classical sense is not carried out, rather a measurement of instantaneous adjusted values of the delay. A certain degree of regulation is first effected in a second step when an evaluation unit (e.g. a micro-controller) "learns", as a result of the measurements, which sweeping voltage corresponds to which delay and takes this into consideration in the subsequent measurements. Such a learning process, compensating for aging and temperature related drifts in the internal delay unit, requires introduction of a time measurement component. This patent application concerns such a time measurement component.

In order to effect such a regulation, the time delay between the transmitted first pulse signal and the second internally delayed pulse signal must be determined. In accordance with prior art, the delay is simply assumed to be the setting of the dead time component. Thereby, as already mentioned above, drifts in the dead time properties of the dead time component as a function of sensor operation temperature and as a function of aging of the sensor as well as due to deviations in the manufactured properties of the differing components of the dead time component cannot be taken into account. For this reason, the time delays determined in accordance with prior art can deviate strongly from the actual delays which, under certain circumstances, leads to a highly inaccurate result for measurement of the separation between two objects.

SUMMARY OF THE INVENTION

One purpose of the present invention is therefore to configure and improve a method of the above mentioned kind for measuring the time delay between two periodic pulse signals having the same frequency in such a manner that the time delay between the two periodic pulses can be determined as accurately as possible.

In order to solve this problem, the invention proposes a method for measuring the time delay between two periodic pulse signals of the above mentioned kind, wherein the method is characterized by the following steps:
 production of a periodic diagnostic signal having half the frequency of the first pulse signal, whose sampling ratio is a measure for the time delay between the first pulse signal and the second pulse signal,
 determination of the sampling ratio of the diagnostic signal, and
 determination of the time delay between the first pulse signal and a second pulse signal using the sampling ratio of the diagnostic signal.

In accordance with the invention, it has been recognized that the regulation loop for regulation of the time delay of the variable dead time member operates in a particularly precise manner when the delay adjusted in the dead time member is determined as accurately as possible. Instead of simply taking the adjusted delay value of the variable dead time member as the value for the actual time delay, in accordance with the present invention, the actual adjusted value for the delay is measured.

The periodic diagnostic signal is advantageously a square wave signal. In a method in accordance with the invention, the delay between the two pulse signals is determined from the sampling ratio of the diagnostic signal. The sampling ratio is given by the ratio between the duration of the HIGH states and the duration of the LOW states of a period relative to the duration of the period of the diagnostic signal. If the HIGH states and the LOWS states within a period are evenly distributed, such as in a square wave signal, then the value of the sampling ratio is approximately 50%. The periodic diagnostic signal is configured in such a fashion that its sampling ratio can be used to determine the time delay between the first pulse signal and the second pulse signal.

The sampling ratio of the diagnostic signal in the absence of a time delay between the first pulse signal and the second pulse signal preferentially assumes values of approximately 50%. In addition, the change in the sampling ratio of the diagnostic signal is preferentially proportional to a time delay between a first pulse signal and a second pulse signal. Accordingly, the sampling ratio assumes values of approximately 100% when the second pulse signal is delayed relative to the first pulse signal by a complete period of the first pulse signal.

In accordance with an advantageous improvement of the present invention, the diagnostic signal is alternately triggered from a side of the first pulse signal and from a side of the second pulse signal.

In accordance with a preferred embodiment, the diagnostic signal is alternately triggered from a rising side of the first pulse signal and from a rising side of the second pulse signal. It is h however also conceivable for the diagnostic signal to be triggered by falling sides of the two pulse signals.

In accordance with an advantageous improvement of the invention:
 a control signal is produced having half the frequency of the first pulse signal,
 the inverted control signal is introduced to a first control input of a multiplexer,
 the first pulse signal is introduced to a first signal input of the multiplexer,
 the control signal is introduced to a second control input of the multiplexer,
 the second pulse signal is introduced to a second signal input of the multiplexer,
 the output of the multiplexer is introduced to a clock input of a first D flip-flop,
 the inverted control signal is introduced to the D-input of the first D flip-flop, and
 the diagnostic signal is present on an output of the first D flip-flop.

In accordance with this improvement, the multiplexer is made from e.g. three NAND gates. The multiplexer then requires two control inputs and two signal inputs. In general, the multiplexer must have at least one control input, at least two signal inputs and at least one output.

In order to determine the sampling ratio of the diagnostic signal, an advantageous improvement of the invention provides for determination of equal fraction portions contained in the diagnostic signal.

In accordance with a preferred embodiment, the inverted diagnostic signal is fed to a first low pass filter. Advantageously, the diagnostic signal is also introduced to a second low pass filter. The equal fraction portions present in the diagnostic signal can then be filtered out in a particularly effective fashion when the sampling ratio of the diagnostic signal is in a region of approximately 50%, as is the case in the present invention. With a sampling ratio near 50%, there are less higher harmonic components than would be the case for a disadvantageous sampling ratio e.g. of 10% or 90%. This simplifies configuration of the low pass smoothing of the diagnostic signal, which must not be of particularly high quality.

A further purpose of the present invention is to configure and improve a method for measuring the distance between two objects in such a fashion that the propagation time of the first pulse signal from the one object to the other object and back and in particular the actual time delay between the transmitted first pulse signal and the delayed second pulse signal is determined to as accurate an extent as possible.

In order to achieve this purpose, the invention proposes a method for measuring the separation between two objects of the above mentioned kind, wherein the adjusted variable time delay is determined through measurement of the time delay between the first pulse signal and the second pulse signal using the method according to the invention.

With the method in accordance with the invention, the delay of the second pulse signal relative to the first pulse signal can be measured with particularly high accuracy. In this manner, the propagation time of the received first pulse signal and thereby the separation between the two objects can be determined in a particularly accurate manner. Systematic errors in delay drifts of the internal delay can thereby be corrected with appropriate software compensation.

The high precision of the propagation time determination using the method in accordance with the invention is due to the fact that the time delay measurement results are independent of drift in the dead time properties of the dead time component due to sensor operating temperature and aging of the sensor and do not depend on production tolerances in the components of the dead time member. The high precision of the propagation time determination is particularly important for measurements of small distances between two objects, since the propagation time of the pulse signals can be extremely short in this case and measuring errors in determining the delay have particularly strong effects on the propagation time determined and therefore on the extracted distances.

In accordance with an advantageous improvement of the invention, a sensor pulse repetition generator produces a periodic repetitive pulse signal and the first pulse signal is generated from a side of the repetitive pulse signal. The first pulse signal is preferentially triggered by the rising side of the repetitive pulse signal. It would also be conceivable to trigger on the falling side of the repetitive pulse signal.

In accordance with another advantageous improvement of the invention, the second pulse signal is triggered by a side of the repetitive pulse signal which is delayed by the variable time delay. The second pulse signal is preferentially triggered from the rising side of the delayed repetitive pulse signal. It would however also be conceivable to trigger on the falling side of the repetitive pulse signal.

The inverted repetitive pulse signal is preferentially introduced to the clock input of a second D flip-flop, a control signal is present at one output of the second D flip-flop and another output of the second D flip-flop has the inverted control signal which is introduced back into the D-input of the second D flip-flop. In this fashion, the above mentioned control signal for controlling the multiplexer is generated in a simple fashion. Other configurations with differing flip-flop types are of course conceivable, without limitation in function.

An additional purpose of the present invention is to configure and improve a device for measuring the time delay between two periodic pulse signals of the above mentioned type in such a fashion that the time delay between the two periodic pulse signals is determined to as accurate an extent as possible.

In order to solve this purpose, the invention proposes a device for measuring the time delay between two periodic pulse signals of the above mentioned kind characterized by:
$6^{th}$ means for producing a periodic diagnostic signal having half the frequency of the first pulse signal, whose sampling ratio is a measure for the time delay between the first pulse signal and the second pulse signal,
$7^{th}$ means for determining the sampling ratio of the diagnostic signal, and
$8^{th}$ means for determining the time delay between the first pulse signal and the second pulse signal from the sampling ratio of the diagnostic signal.

In accordance with an advantageous improvement, the $6^{th}$ means are configured in such a fashion that the diagnostic signal is alternately triggered from one side of the first pulse signal and from one side of the second pulse signal. The $6^{th}$ means are advantageously configured in such a fashion that the diagnostic signal is alternately triggered from a rising side of the first pulse signal and from a rising side of the second pulse signal. Alternatively, it is also conceivable for the diagnostic signal to be alternately triggered from the falling sides of the first pulse signal and of the second pulse signal.

In accordance with an advantageous improvement of the invention, the $6^{th}$ means comprise:
means for producing a control signal having half the frequency of the first pulse signal,
a multiplexer having a first input to which the inverted control signal is applied, and having the first pulse signal present on its second input, wherein its third input has the control signal, and its fourth input the second pulse signal, and
a first D flip-flop having the output of the multiplexer on its clock input and the inverted control signal on its D input, wherein its output is the diagnostic signal.
In accordance with another preferred embodiment, the multiplexer comprises three NAND gates, wherein the inverted control signal is applied to a first input of the first NAND gate and the first pulse signal is applied to a second input of the first NAND gate, wherein the control signal is applied to a first input of the second NAND gate and the second pulse signal is applied to the second input of the second NAND gate, wherein the output of the first NAND gate is applied to a first input of the first NAND gate and the output of the second NAND gate is applied to a second input of a third NAND gate, and wherein the output of the third NAND gate is applied to the clock input of the first D flip-flop. A multiplexer made in this fashion from three NAND gates is particularly inexpensive. In this manner, the device in accordance with the invention does not require particularly fast and therefore very expensive components. Despite the relatively slow switching times and necessary stable signal holding times for the standard components utilized in the device in accordance with the invention (D flip-flops and NAND gates), a proper circuiting of these components leads to the reliable and highly precise determination of small delays between two pulse signals. In this fashion, even delays which are less than the above mentioned internal switching times and required holding times can be easily determined.

The second means preferentially have a first low pass filter for determining the equal fraction content in the inverted diagnostic signal. The second means should also have a second low pass filter for determining the equal fraction content of the diagnostic signal.

Finally, it is a purpose of the present invention to improve and configure a sensor of the above mentioned kind in such a fashion that the propagation time of the first pulse signal from one object to the other object and back, in particular the actual delay between the transmitted first pulse signal and the delayed second pulse signal, is determined as accurately as possible.

In order to solve this problem, the invention proposes a sensor of the above mentioned kind, wherein the fifth means comprise a device according to one of the claims 15 to 21 to measure the time delay between the first pulse signal and the second pulse signal.

The first means advantageously have a repetitive pulse generator for producing a periodic repetitive pulse signal and a first mono-flop to trigger the first pulse signal from a flank of the repetitive pulse signal. The mono-flop is then required in the event that the first pulse signal is a radar signal. In general however, the invention can be exercised without a mono-flop. The mono-flop serves for uniform signal formation.

The third means likewise advantageously have a repetitive pulse generator for producing a periodic repetitive pulse signal, a dead time component for delaying the repetitive pulse signal by a variable delay and a second mono-flop for triggering the second pulse signal from a side of the delayed repetitive pulse signal. Both the first pulse signal as well as the second pulse signal are preferentially triggered from the rising side of the repetitive pulse signal or of the delayed repetitive pulse signal. In addition, the first pulse signal and the second pulse signal are preferentially triggered from the same repetitive pulse signal, produced from a common repetitive pulse signal generator.

In accordance with a preferred embodiment, the sensor has a second D flip-flop for producing a control signal, wherein the inverted repetitive pulse signal is applied to its clock input and the inverted control signal is present at its D input. In this fashion, the control signal can be easily produced from the repetitive pulse signal having half the frequency of the first pulse signal. The D flip-flop used to produce the control signal is a standard component having a particularly low component price.

The sensor preferentially has a forth NAND gate for inverting the repetitive pulse signal. This NAND gate is also a standard component having a particularly low individual component price. In addition, the fourth NAND gate can be an component integral with the other three NAND gates of the multiplexer. In this manner, the effects of temperature changes on the electrical properties of the NAND gates are approximately equal and can be easily compensated for through proper circuiting of the NAND gates.

Preferred embodiments of the present invention will be described below with reference to the drawing.

DESCRIPTION OF THE PREFERRED EMBODIMENT

In order to measure the distance between two objects using a sensor which is disposed on one of the two objects, sensors are usually utilized which determined the propagation time of a first periodic pulse signal 2 between a transmission time from the sensor, to reflection on the other object and up to reception by the sensor.

Due to the relatively high propagation speeds of the pulse signals utilized, the propagation times to be determined for the first pulse signal 2, assuming a maximum measuring region of several meters, in particular for pulse radar sensors, lie in the nanosecond range. These extremely short propagation times for the first pulse signal 2 cannot be directly measured by e.g. setting a clock with a START at transmission of the signal and with a STOP upon receipt of the reflected signal. Rather, indirect comparative methods must be utilized to determine the pulse propagation times.

Figure 1:
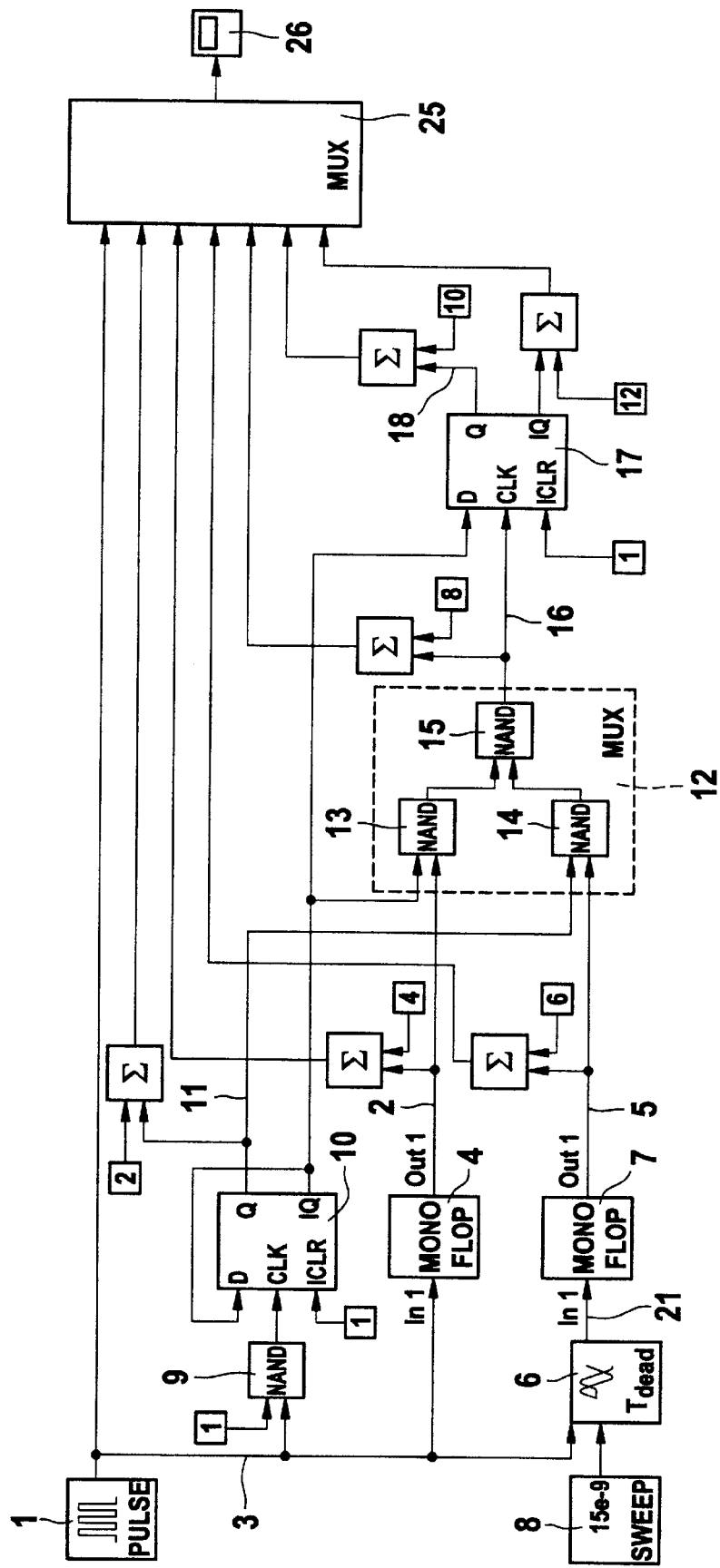
FIG. 1 shows a first embodiment of a circuit of a device in accordance with the invention for measuring the time delay between two periodic pulse signals for use in a sensor in accordance with the invention.

In such a comparative method, a repetitive pulse generator 1 of the sensor produces the first periodic pulse signal 2. The first periodic pulse signal 2 requires a certain propagation time between transmission by the sensor, reflection on the other object and reception by the sensor. In order to determine this propagation time, the sensor produces a second periodic pulse signal 5, having the same frequency as the first pulse signal 2, which is delayed by a predetermined delay relative to the first pulse signal 2 via a variable dead time component 6 inside the sensor. Control of the variable dead time component 6 is thereby effected by means of a relatively slowly varying sweep voltage 8. In the circuit of FIG. 1, control of the dead time component 6 is effected using a constant voltage, so that the delay assumes values of $15 \cdot 10^{-9} = 15$ ns.

Both the received first pulse signal as well as the delayed second pulse signal 5 are introduced to a mixer which then produces a maximum output signal when the propagation time of the received first pulse signal is equal to the delay in the second pulse signal 5 as adjusted by the variable dead time component 6.

Measurement of the actual adjusted delay facilitates a monitoring of the sweep voltage 8 by a control unit (micro controller) so that the sweep voltage values can be output in order to achieve a desired internal delay. The monitoring of the actual internal delay by the device in accordance with the invention thereby allows for compensation of possible deviations in the response characteristics of the dead time component 6. In this fashion, the propagation time of the first pulse signal 2 can be determined based on the adjusted delay and the propagation time can be used to determine the separation between the two objects.

In order to achieve such a regulation, it is necessary to determine the time delay between the transmitted first pulse signal 2 and the delayed second pulse signal 5. This is achieved in accordance with the invention in that a periodic diagnostic signal 18 is produced having half the frequency of the first pulse signal 2. The sampling ratio of the diagnostic signal 18 is a measure for the time delay between the first pulse signal 2 and the second pulse single 5. The time delay between the transmitted first pulse signal 2 and the second pulse signal 5 is then determined by determining the sampling ratio of the diagnostic signal 18.

Figure 2:
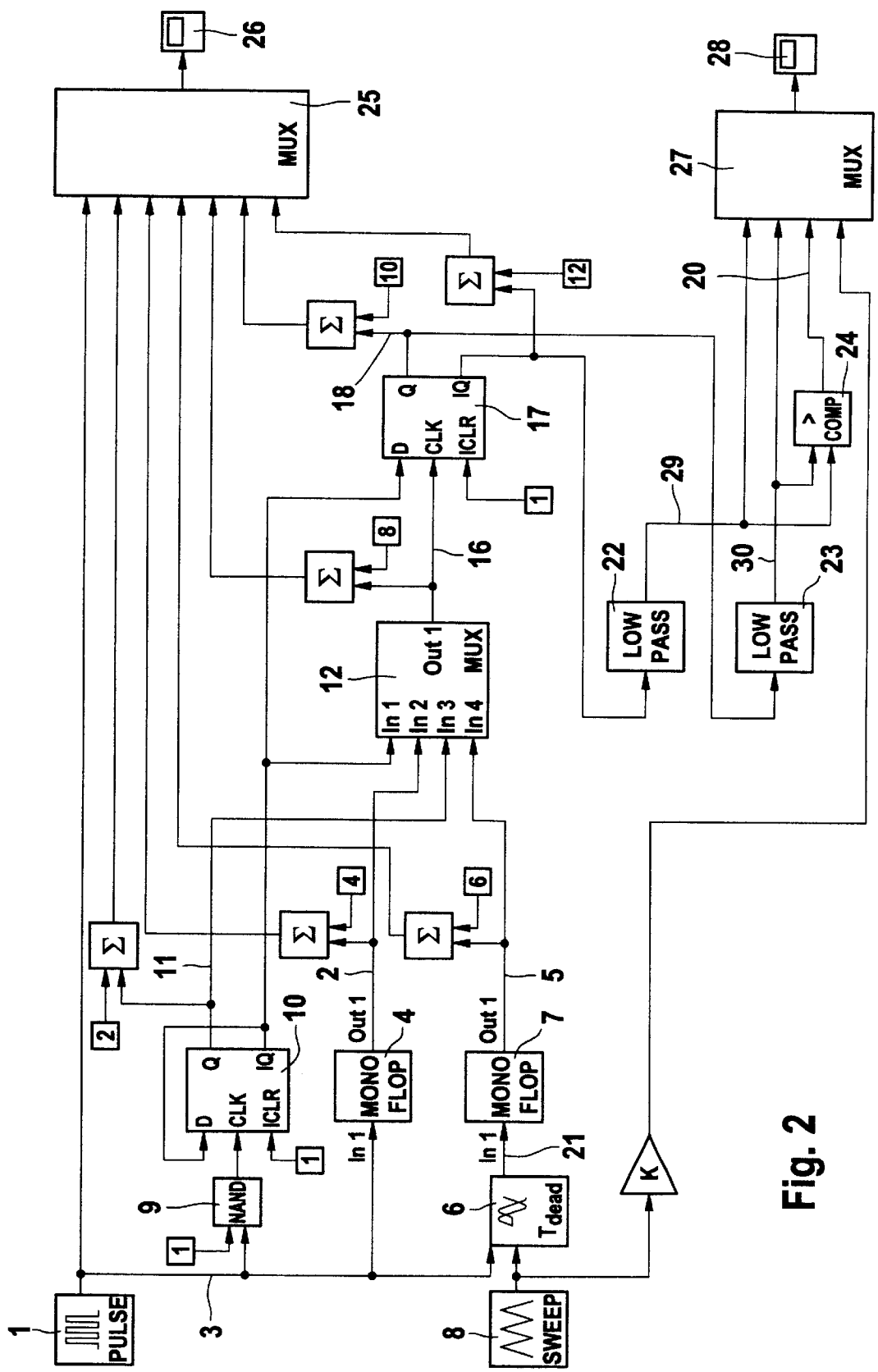
FIG. 2 shows a second embodiment of a circuit of a device in accordance with the invention for measuring the time delay between two periodic pulse signals for use in a sensor in accordance with the invention.

In FIGS. 1 and 2, the "Σ" symbol represents summing devices. The inputs to the summing devices in boxes designated with Arabic numerals have the following meaning. The signal 1 input to flip flop 17 is a constant DC signal. The signal 1 at NAND gate 9 is also a constant DC signal. The signals 2, 4, 6, 8, 10 and 12 to the summing devices are different DC offsets to permit the signals to be viewed on a common oscilloscope.

More precisely, the circuit of FIG. 1 works as follows. The repetitive pulse generator 1 triggers periodic transmission of the first pulse 2. The repetitive pulse generator 1 is driven e.g. with a frequency of e.g. 16 MHz. The repetitive pulse generator 1 initially produces a repetitive pulse signal 3 which is fed to a first mono-flop 4 in which the first pulse signal 2 is produced from the repetitive pulse signal 3. The first pulse signal 2 has the same frequency as the repetitive pulse signal 3. The rising sides of the receptive pulse signal 3 trigger the pulses of the first pulse signal 2.

In addition, the repetitive pulse generator 1 triggers a second pulse signal 5 which is delayed in time relative to the first pulse signal 2. Towards this end, the repetitive pulse signal 3 is delayed by a predetermined delay using a variable dead time component 6. The delay of the dead time component 6 is effected by means of a relatively slowly varying sweeping voltage 8. In the embodiment of FIG. 1, the sweeping voltage 8 is adjusted to a constant value to produce a delay of 15 ns. The delayed repetitive pulse signal 21 is introduced to a second mono-flop 7 in which the second pulse signal 5 is produced. The second pulse signal 5 has the same frequency as the first pulse signal 3. The rising sides of the delayed repetitive pulse signal 21 trigger the pulses of the second pulse signal 5.

The repetitive pulse signal 3 is, in addition, fed to the clock input CLK of a D flip-flop 10 via a NAND gate 9. The NAND gate 9 inverts the repetitive pulse signal 3. Inversion of the repetitive pulse signal 3 is necessary, since the D flip-flop 10 is clocked with the positive side of the repetitive pulse signal 3. The D flip-flop 10 produces a square wave control signal 11 from the repetitive pulse signal 3 having half the frequency of the repetitive pulse signal 3 and thereby also half the frequency of the first pulse signal 2. The sides of the control signal 11 are triggered with the falling sides of the repetitive pulse signal 3.

The circuit of FIG. 1 also has a multiplexer 12. The multiplexer 12 consists essentially of 3 NAND gates 13, 14, 15. The inverted control signal 11 and the first pulse signal 2 are applied to the inputs of the first NAND gate 13. The control signal 11 and the second pulse signal 5 are applied to the inputs of the second NAND gate 14. The outputs of the first NAND gate 13 and the second NAND gate 14 are applied to the inputs of the third NAND gate 15. The output of the third NAND gate, i.e. the output of the multiplexer 12, is then passed to the clock input CLK of an additional D flip-flop 17. When the control signal 11 is LOW then the first pulse signal 2 is passed through to the clock input CLK of the D flip-flop 17. However when the control signal 11 is HIGH, then the second pulse signal 5 is passed to the clock input CLK of the D flip-flop 17.

The D flip-flop 17 is set by each second rising side of the first pulse signal 2 and reset by each second rising side of the second pulse signal 5. If the first pulse signal 2 and the second pulse signal 5 are not time delayed relative to each other, the output Q of the D flip-flop 17 is in the form of a rectangular wave generator having a sampling ratio between HIGH and LOW of exactly 50%. The period of the diagnostic signal 18 present at the output Q of the D flip-flop 17 thereby corresponds to the period of the control signal 11 and thereby to half the period of the first pulse signal 2.

If as shown in the embodiment of FIG. 1, a delay of 15 ns is then adjusted on the variable dead time component 6, the sampling ratio of the diagnostic signal 18 is then displaced in a corresponding fashion. The time during which the diagnostic signal 18 is HIGH is given by one half of the period duration of the diagnostic signal 18 plus the ratio between the time delay and the overall period. The overall period is twice the period of the first pulse 2 and is therefore known. The sampling ratio X at the output Q of the flip-flop 17 can therefore be calculated as follows:

$$X_Q=50\%+0.5\cdot 15 \text{ ns}\cdot 16 \text{ MHz}=50\%+12\%=62\%.$$

Likewise the sampling ratio at the inverted output |Q of the second D flip-flop 17 is given as
$X_{|Q}=50\%-0.5\cdot 15 \text{ ns}\cdot 16 \text{ MHz}=50\% -12\%=38\%$.

The sampling ratio of the diagnostic signal 18 of the D flip-flop 17 can therefore be used to precisely determine the actual delay between the first pulse signal 2 transmitted by the sensor and the delayed second pulse signal 5.

Figure 3:
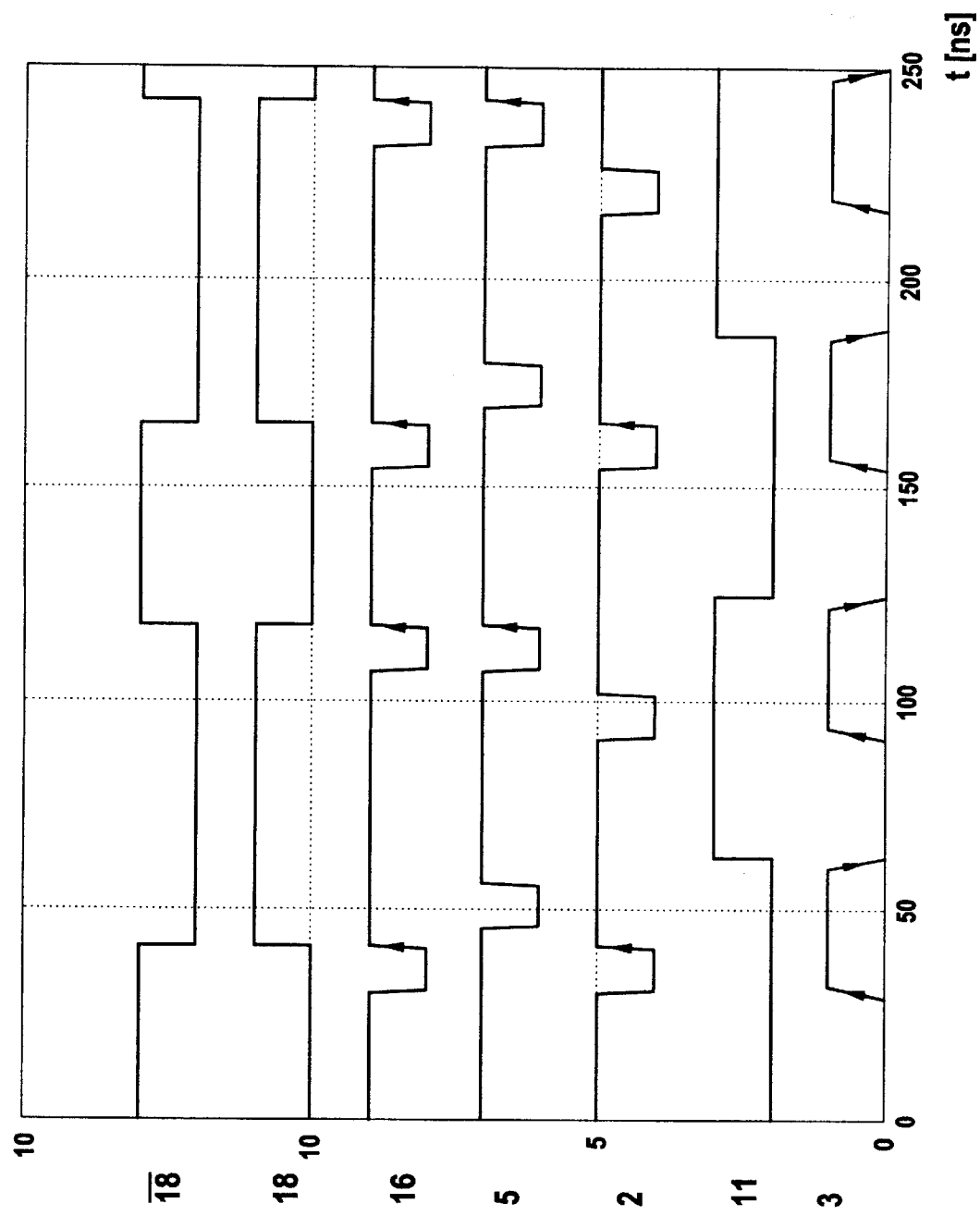
FIG. 3 shows the signal dependence of different signals from the circuits of FIGS. 1 and 2.

The repetitive pulse signal 3, the control signal 11, the first pulse signal 2, the second pulse signal 5, the output signal 16 of the multiplexer 12, the diagnostic signal 18 and the inverted diagnostic signal 18 are applied to the inputs of an additional multiplexer 25. This multiplexer 25 only serves to show a plurality of channels on a first oscilloscope 26 for illustration of this exemplary circuit. The output of the multiplexer 25 is connected to the first oscilloscope 26 to show the signal dependencies. The signal dependencies of the oscilloscope 26 are shown in FIG. 3.

The sampling ratio of the diagnostic signal 18 can then be determined by determining the equal fraction portion of the diagnostic signal 18. The equal fraction portion of the inverted diagnostic signal 18 is determined by means of a first low pass 22 (compare FIG. 2). Likewise, the equal fraction portion of the diagnostic signal 18 is determined by means of a second low pass 23. The outputs of the low pass filters 22 and 23 are introduced to a comparator 24.

The output signal 29 of the first low pass 22, the output signal 30 of the second low pass 23, the output signal 20 of the comparator 24 and the sweep voltage 8 are applied to the inputs of an additional multiplexer 27. In order to show the signal dependencies, the output of the multiplexer 27 is applied to a second oscilloscope 28. The signal dependencies of the oscilloscope 28 are shown in FIG. 4.

Figure 4:
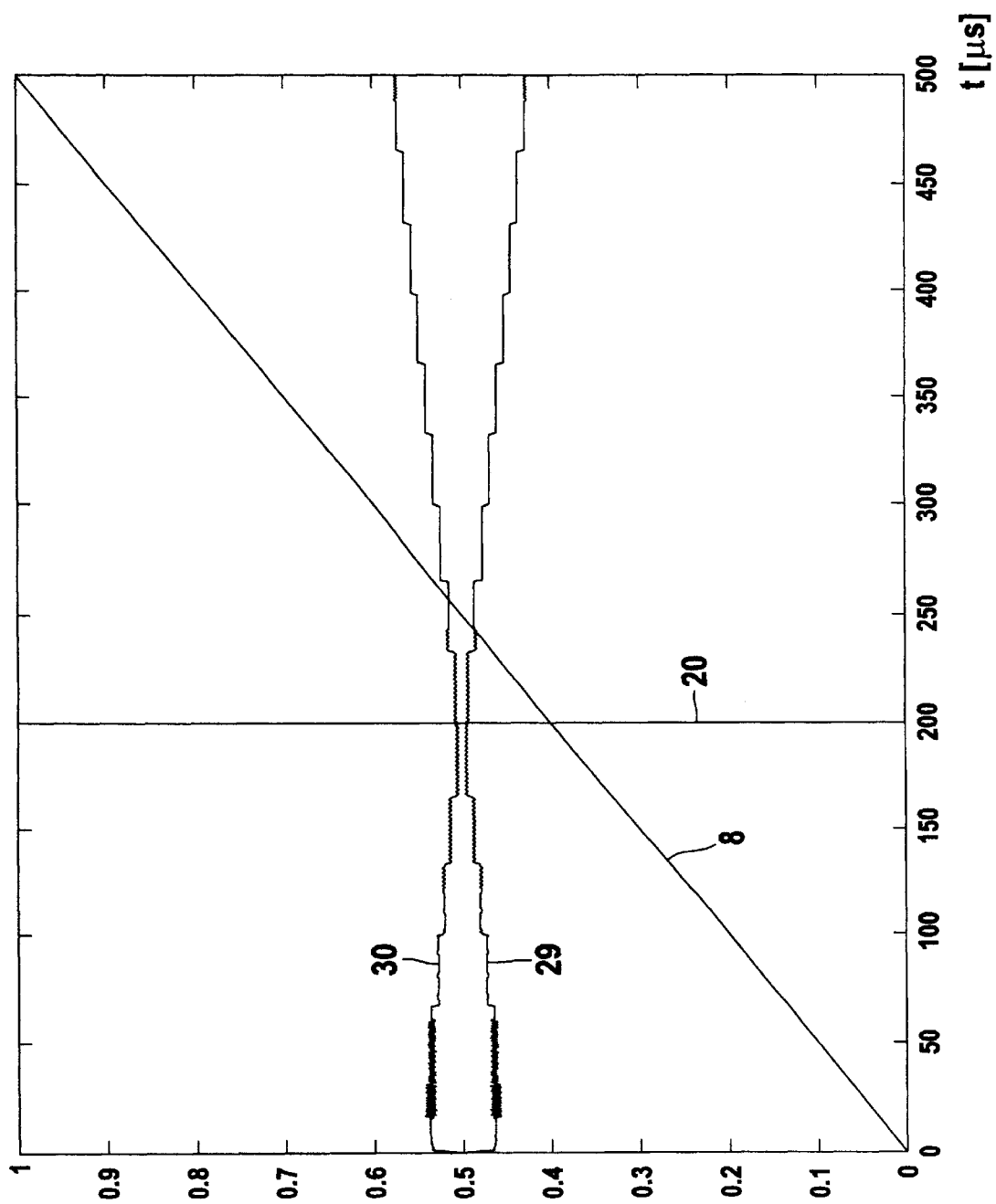
FIG. 4 shows the signal dependence of various signals from the circuit of FIG. 2.

As can be seen in FIG. 4, variation of the sweep voltage 8 causes associated variation of the sampling ratio of the diagnostic signal 18 and of the inverted diagnostic signal. Simultaneously, the equal fraction portions of the diagnostic signal 18 and of the inverted diagnostic signal 18 change and thereby also the output signals 29 and 30 of the low pass filters 22 and 23. As can be clearly seen in FIG. 4, the output signal 20 of the comparator 24 switches from 0 to 1 at the point in time at which the output signal 29 of the first low pass 22 and the output signal 30 of the second low pass 23 are of equal size, i.e. at the point in time at which the sampling ratio of the diagnostic signal 18 is 50%, and when the second pulse signal 5 is not delayed relative to the first pulse signal 2.

With the assistance of the circuits shown in FIGS. 1 and 2, the actual delay between the first pulse signal 2 and the second pulse signal 5 can be determined in a particularly precise fashion to allow for a particularly precise determination of the propagation time of the first pulse signal 2 from the one object to the object and back and thereby for a particularly precise measurement of the distance between these two objects. In addition, the device in accordance with the invention indicates when the sampling ratio of the diagnostic signal 18 is precisely 50%, i.e. when the adjusted delay is 0. This point is important for calibrating the device in accordance with the invention.

The circuits shown in FIGS. 1 and 2 comprise substantially low cost, standard components. Up to this point in time, special rapidly switching components were used to determine small separations (e.g. less than 10 m) between two objects by means of a pulse signal, i.e. with very small time separations between two pulse trigger sides. However, such components are very expensive. With the circuit in accordance with the invention in accordance with FIGS. 1 and 2, slowly switching standard components (NAND gates and D flip-flops) are used. The standard components are advantageously circuited together in such a fashion that, despite the use of standard components, the circuit can even determine small time separations between two pulse trigger sides which are less than the switching times and signal holding times of the standard components to thereby also facilitate measurement of small separations between two objects.

Moreover, the four NAND gates 9, 13, 14, 15 can be integrated into one component. In this fashion, the drift due to operating temperature changes is approximately the same in all four NAND gates 9, 13, 14, 15. The NAND gates 9, 13, 14, 15 are advantageously integrated into the circuits of FIGS. 1 and 2 in such a fashion that the drift in the individual NAND gates 9, 13, 14, 15 is compensated for and makes very little or no difference in the measured results. In addition, the signal paths for the triggering first pulse 2 and the triggering second pulse 5 are identical up to the second separate NAND gates 13, 14 in the multiplexer 12, so that a possible drift in the elements along the common paths (NAND 15 and D flip-flop 17) does not play any role in the comparative measurement. Since the separate NAND gates 13, 14 are integrated monolithically, their absolute temperature drift is also compensated for.

Figure 5:
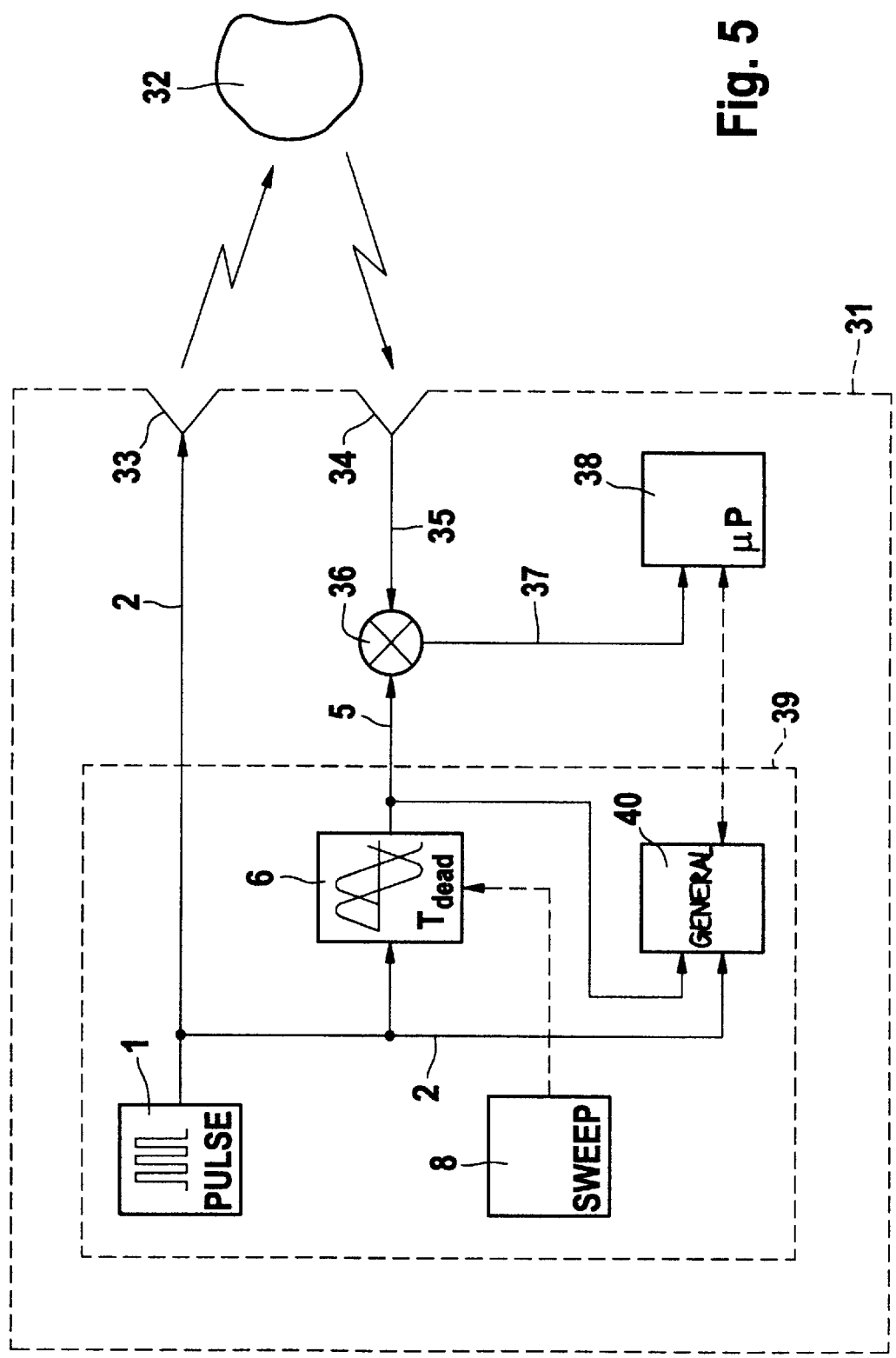
FIG. 5 shows an embodiment of the invention for use in measuring a separation between two objects.

FIG. 5 shows a device for measuring the separation between two objects 31, 32 using radar radiation. The device for measuring the separation is disposed on one of the objects 31. The object 31 is e.g. a motor vehicle whose separation from object 32 is to be measured, e.g. during parking. In the device, a first periodic pulse signal 2 is produced by a repetitive pulse generator 1. The first pulse signal 2 is radiated via a transmission antenna 33 in the direction towards the object 32. The first pulse signal 2 is reflected from the object 32 and detected by the system via a reception antenna 34. The received pulse signal 35 has a certain propagation time delay relative to the first pulse signal 2, wherein the propagation time delay depends on a separation between the two objects 31, 32. In order to be able to determine the separation, the propagation time of the first signal 2 between the transmission antenna 33 up to the reception antenna 34 must be measured.

The propagation time of the first pulse signal 2 can be extremely short, in particular when using radar radiation, and cannot be determined simply by starting and stopping a clock. In order to measure the propagation time, a comparative measurement procedure is therefore utilized. Within the framework of this comparative measurement procedure, a second periodic pulse signal 5 is produced which is delayed relative to the first pulse signal 2 by a variable delay, wherein the delay is determined by a dead time component 6. The control of the dead time component 6 is effected by means of a sweeping voltage 8. The received pulse signal 35 and the second pulse 5 are introduced to a mixer 36 whose output signal 37 is maximum when the adjusted variable delay of the second pulse signal 5 is equal to the propagation time of the first pulse signal 2, i.e. corresponds to the delay between the received pulse signal 35 and the first pulse signal 2. The output signal 37 of the mixer 36 is introduced to a computer 38 for evaluation. The computer 38 controls processing of the entire distance separation measurement in the device of FIG. 5.

When a maximum is present on the mixer output signal 37, the delay of the second pulse signal 5 adjusted on the dead time component 6 is a measure of the propagation time of the first pulse signal 2. The present invention is utilized to measure this dead time component 6 delay. It would be theoretically possible to simply sweep the variable delay of the second pulse signal 5 through a time range corresponding to the measuring range of the distance measuring system. However, since the dead time component 6 is an analog device, drifts in the dead time component properties as a function of operating temperature and operation life time of the system as well as variations in the production tolerances of components are unavoidable. For this reason, the delay in the second pulse signal 5 must be regulated.

Towards this end, the circuits in accordance with the invention, described in FIG. 1 and FIG. 2, are used. These circuits are schematically designated in FIG. 5 as reference symbols 39, wherein the components of the circuit not shown in FIG. 5 are indicated as a general circuit component 40. Measurement of the delay adjusted on the dead time member 6 is effected either continuously or is triggered by the computer 38.

We claim:

1. A method for measuring a time delay between a first periodic pulse signal and a second periodic pulse signal having a same frequency as the first pulse signal, the method comprising the steps of:

a) generating a periodic diagnostic signal having half the frequency of the first pulse signal, said diagnostic signal having a sampling ratio which is a measure of the time delay between the first pulse signal and the second pulse signal;

b) measuring said sampling ratio of said diagnostic signal; and c) calculating the time delay between the first pulse signal and the second pulse signal from said sampling ratio of said diagnostic signal.

2. The method of claim 1, wherein step a) comprises alternately triggering said diagnostic signal from a side of the first pulse signal and from a side of the second pulse signal.

3. The method of claim 2, wherein said diagnostic signal is alternately triggered from a rising side of the first pulse signal and from a rising side of the second pulse signal.

4. The method of claim 2, wherein step a) further comprises:

a1) generating a control signal having half the frequency of the first pulse signal;

a2) inverting said control signal and applying said inverted control signal to a first control input of a multiplexer;

a3) applying the first pulse signal to a first signal input of said multiplexer;

a4) applying said control signal to a second control input of said multiplexer;

a5) applying the second pulse signal to a second signal input of said multiplexer;

a6) applying an output of said multiplexer to a clock input of a first D flip-flop;

a7) applying said inverted control signal to a D input of said first D flip-flop; and a8) extracting said diagnostic signal at a Q output of said first D flip-flop.

5. The method of claim 1, wherein step b) comprises the step of determining an equal fraction portion contained in said diagnostic signal for extraction of said sampling ratio of said diagnostic signal.

6. The method of claim 5, wherein said inverted diagnostic signal is passed to a first low pass filter.

7. The method of claim 5, wherein said diagnostic signal is passed to a second low pass filter.

8. The method of claim 1, wherein said sampling ratio of said diagnostic signal is approximately 50% when there is no time delay between the first pulse signal and the second pulse signal, and wherein said sampling ratio changes in proportion to the time delay between the first pulse signal and the second pulse signal.

9. The method of claim 1, for measuring a distance between a first and a second object using a sensor disposed on one of the objects, the method further comprising the steps of:
   triggering a sensor to transmit the first periodic pulse signal towards the second object;
   receiving, with the sensor, the first pulse signal after reflection thereof from the second object, the first pulse signal delayed by a propagation time dependent on the distance between the first and the second objects;
   triggering the second periodic pulse signal and delaying the second periodic pulse signal by a time delay;
   varying said time delay of the second pulse signal; and
   determining a time delay which is equal to the propagation time of the received, reflected first pulse signal.

10. The method of claim 9, further comprising generating a periodic repetitive pulse signal using a sensor repetitive pulse generator, wherein the first periodic pulse signal is triggered from a side of said repetitive pulse signal.

11. The method of claim 10, wherein the first pulse signal is triggered from a rising side of said repetitive pulse signal.

12. The method of claim 10, wherein the second pulse signal is triggered from a side of said repetitive pulse signal after said time delay.

13. The method of claim 12, wherein the second pulse signal is triggered from a rising side of said repetitive pulse signal after said time delay.

14. The method of claim 10, further comprising inverting said repetitive pulse signal and applying said inverted repetitive pulse signal to a clock input of a second D flip-flop, wherein a control signal is present on a Q output of said second D flip-flop, and an inverted control signal is present at an additional Q output of said second D flip-flop, wherein said inverted control signal is applied to a D input of said second D flip-flop.

15. Device for measuring a time delay between a first periodic pulse signal and a second periodic pulse signal having a same frequency as the first pulse signal, comprising:
   sixth means for producing a periodic diagnostic signal having half a frequency of the first pulse signal, said diagnostic signal having a sampling ratio which is a measure of a time delay between the first pulse signal and the second pulse signal;
   seventh means for determining said sampling ratio of said diagnostic signal; and
   eighth means for determining a time delay between the first pulse signal and the second pulse signal from said sampling ratio of said diagnostic signal.

16. The device of claim 15, wherein said sixth means comprise means for alternately triggering said diagnostic signal from a side of the first pulse signal and from side of the second pulse signal.

17. The device of claim 16, wherein said diagnostic signal is alternately triggered from a rising side of the first pulse signal and from a rising side of the second pulse signal.

18. The device of claim 16, wherein said sixth means comprise:
   means for producing a control signal having half a frequency of the first pulse signal,
   a multiplexer having an inverted control signal applied to a first input thereof and the first pulse signal applied to a second input thereof, wherein a control signal is applied to a third input thereof, and the second pulse signal is applied to a fourth input thereof; and
   a first D flip-flop having a clock input to which an output of said multiplexer is applied and having a D input to which said inverted control signal is applied, wherein said diagnostic signal is available at a Q output thereof.

19. The device of claim 18, wherein said multiplexer comprises first, second and third NAND gates, wherein said inverted control signal is applied to a first input of said first NAND gate and the first pulse signal is applied to a second input of said first NAND gate, wherein said control signal is applied to a first input of said second NAND gate and the second pulse signal is applied to a second input of said second NAND gate, wherein an output of said first NAND gate is applied to a first input of said third NAND gate and an output of said second NAND gate is applied to a second input of said third NAND gate, wherein an output of said third NAND gate is applied to a clock input of said first D flip-flop.

20. The device of claim 15, wherein said seventh means comprise a first low pass filter for determining equal fraction portions contained in an inverted diagnostic signal.

21. The device of claim 15, wherein said seventh means comprise a second low pass filter for determining an equal fraction portion contained in said diagnostic signal.

22. The device of claim 15, the device having a sensor for measuring a distance between a first and a second object, the sensor disposed on the first object, the sensor comprising:
   first means for triggering and for transmitting the first periodic pulse signal in a direction towards the second object;
   second means for receiving the first pulse signal after reflection from the second object and delayed by a propagation time depending on the distance between the first and the second objects;
   third means for triggering the second periodic pulse signal and for delaying the second periodic pulse signal by a time delay;
   fourth means for varying said time delay of the second pulse signal; and
   fifth means for determining a time delay which is equal to the propagation time of the received, reflected first pulse signal.

23. The sensor of claim 22, wherein said first means comprise a repetitive pulse generator for producing a periodic repetitive pulse signal and a first mono-flop for triggering the first pulse signal from a side of said repetitive pulse signal.

24. The sensor of claim 22, wherein said third means comprise a repetitive pulse generator for producing a repetitive pulse signal, a dead time component for delaying said repetitive pulse signal by said time delay and a second mono-flop for triggering the second pulse signal from a side of said delayed repetitive pulse signal.

25. The sensor of claim 22, further comprising a second D flip-flop for producing a control signal, said second D flip-flop having a clock input to which an inverted periodic pulse signal is applied, and a D input to which an inverted control signal is applied.

26. The sensor of claim 25, further comprising a fourth NAND gate for inverting the periodic pulse signal.

* * * * *